(12) United States Patent
Yamabi

(10) Patent No.: US 8,698,270 B2
(45) Date of Patent: Apr. 15, 2014

(54) SEMICONDUCTOR LIGHT RECEIVING DEVICE WITH AN OFF-CENTERED LIGHT RECEIVING PART

(75) Inventor: Ryuji Yamabi, Yokohama (JP)

(73) Assignee: Sumitomo Electric Device Innovations, Inc., Yokohama-shi (JP)

(*) Notice: Subject to any disclaimer, the term of this patent is extended or adjusted under 35 U.S.C. 154(b) by 0 days.

(21) Appl. No.: 13/117,718

(22) Filed: May 27, 2011

(65) Prior Publication Data

US 2011/0291221 A1 Dec. 1, 2011

(30) Foreign Application Priority Data

May 27, 2010 (JP) .................... 2010-122134

(51) Int. Cl.
*H01L 27/15* (2006.01)
*H01L 29/267* (2006.01)
*H01L 31/12* (2006.01)
*H01L 33/00* (2010.01)
*H01L 29/417* (2006.01)

(52) U.S. Cl.
CPC .................... *H01L 29/417* (2013.01)
USPC .............. 257/459; 257/81; 257/692

(58) Field of Classification Search
CPC .................................... H01L 29/417
USPC ............................. 257/459, 81, 692
See application file for complete search history.

(56) References Cited

U.S. PATENT DOCUMENTS

| 5,315,104 | A * | 5/1994 | Plumb ............... 250/214.1 |
| 5,712,504 | A * | 1/1998 | Yano et al. ............ 257/452 |
| 7,667,321 | B2 * | 2/2010 | Rebelo et al. ......... 257/728 |
| 7,692,227 | B2 * | 4/2010 | Yamabi et al. ........ 257/292 |
| 2006/0273421 | A1 | 12/2006 | Yasuoka et al. | |

FOREIGN PATENT DOCUMENTS

JP    2006-339413 A    12/2006

* cited by examiner

*Primary Examiner* — Kimberly Rizkallah
*Assistant Examiner* — Alexander Belousov
(74) *Attorney, Agent, or Firm* — Westerman, Hattori, Daniels & Adrian, LLP

(57) ABSTRACT

A semiconductor light receiving device includes: a substrate having a rectangular shape with first through fourth corners, a multilayer structure formed on the substrate, a light receiving part having a mesa structure positioned at a first corner side from a center part of the rectangular shape of the substrate, a first electrode pad provided on the semiconductor substrate, and a second electrode pad provided on the semiconductor substrate so as to be close to a second corner diagonally opposite to the first corner, a first minimum distance between the second electrode pad and an edge of the substrate being longer than a second minimum distance between the first electrode pad and the edge of the substrate.

12 Claims, 5 Drawing Sheets

SEMICONDUCTOR LIGHT RECEIVING DEVICE WITH AN OFF-CENTERED LIGHT RECEIVING PART

CROSS-REFERENCE TO RELATED APPLICATION

This application is based upon and claims the benefit of priority of the prior Japanese Patent Application No. 2010-122134, filed on May 27, 2010, the entire contents of which are incorporated herein by reference.

BACKGROUND (i) Technical Field

The present invention relates to a semiconductor light receiving device.

(ii) Related Art

There is known a semiconductor light receiving device having a mesa structure. The semiconductor light receiving device having the mesa structure has an n-type semiconductor layer, a light absorbing layer and a p-type semiconductor stacked on a semiconductor substrate in that order, and has an n-side electrode connected to the n-type semiconductor layer and a p-side electrode connected to the p-type semiconductor layer. There is also known a semiconductor light receiving device is provided on a plurality of n-side electrodes and/or a plurality of p-side electrodes. For example, Japanese Patent Application Publication No. 2006-339413.

SUMMARY

Recently, downsizing of the semiconductor light receiving devices has been required. Downsizing of the devices is advanced. Then, the size of the electrode pads becomes small (i.e. 500 μm×500 μm or smaller). If wire bonding is not carried out precisely, a wire may protrude from an electrode pad. And leakage current may flow through the protruding wire between the electrode pad and the semiconductor substrate. Such leakage current may degrade the characteristics of the semiconductor light receiving device.

According to an aspect of the present invention, there is provided a semiconductor light receiving device including: a substrate having a rectangular shape with first through fourth corners; a multilayer structure formed on the substrate, the multilayer structure having a first semiconductor layer of a first conduction type, a light absorbing layer, and a second conduction layer of a second conduction type stacked on a semiconductor substrate in that order; a light receiving part having a mesa structure including at least the second semiconductor structure and the light absorbing layer, the mesa structure positioned at the first corner side from the center part of the rectangular shape of the substrate; a first electrode pad provided on the semiconductor substrate and electrically connected to the first semiconductor layer; and a second electrode pad provided on the semiconductor substrate so as to be close to the second corner diagonally opposite to the first corner and electrically connected to the second semiconductor layer, a first minimum distance between the second electrode pad and an edge of the substrate being longer than a second minimum distance between the first electrode pad and the edge of the substrate.

DETAILED DESCRIPTION

A description will now be given of exemplary embodiments of the present invention with reference to the accompanying drawings.

Figure 1:
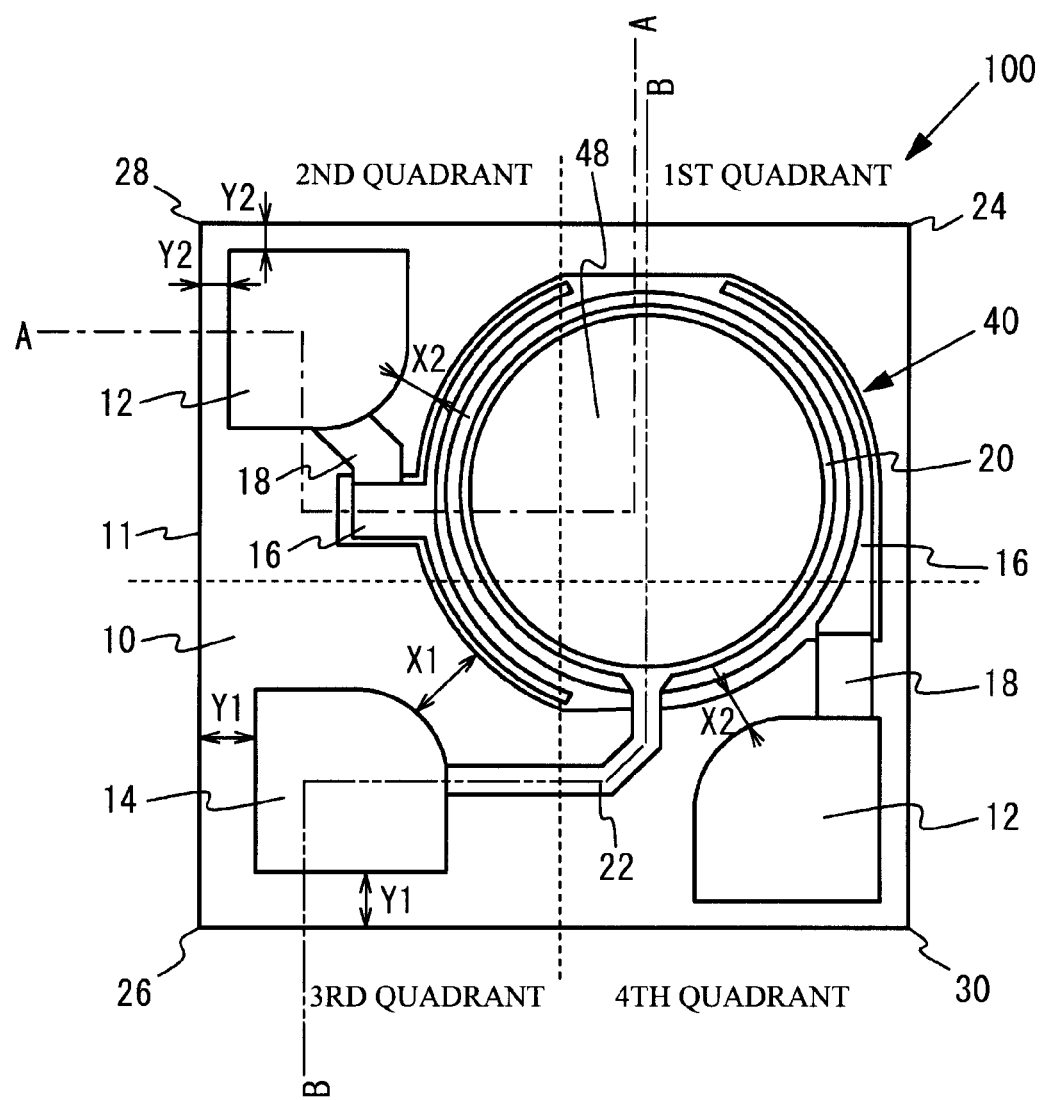
FIG. 1 is a schematic plan view of a semiconductor light receiving device in accordance with a first embodiment.

FIG. 1 is a schematic plan view of a semiconductor light receiving device in accordance with a first embodiment. Referring to FIG. 1, a semiconductor light receiving device 100 has a multilayer structure having a light receiving part 40, two n-side electrode pads 12 and one p-side electrode pad 14. The multilayer structure has an n-type InGaAs layer, an InGaAs light absorbing layer, and a p-type InGaAs layer, which layers are stacked on a semiconductor substrate 10 in that order. The semiconductor substrate 10 may be a semi-insulating InP substrate, for example. The light receiving part 40 has a mesa structure having the InGaAs light absorbing layer and the p-type InGaAs layer. The two n-side electrode pads 12 are electrically connected to the n-side InGaAs layer. The p-side electrode pad 14 is electrically connected to the p-type InGaAs layer. The n-side electrode pads 12 and the p-side electrode pad 14 may be a multilayer composed of Ti, Pt and Au stacked in this order from the semiconductor substrate 10. The n-side electrode pads 12 and the p-side electrode pad 14 are wire bonding pads. The sizes of the n-side electrode pads 12 and the p-side electrode pad 14 depend on the precision of wire bonding, and may be identical to each other.

Two n-type ohmic electrodes 16 are provided on the n-type InGaAs layer and are respectively connected to the two n-side electrode pads 12 by interconnections 18, which may be made of Au, for example. Thus, the n-side electrode pads 12 and the n-type InGaAs layer are electrically connected to each other. The two n-type ohmic electrodes 16 are located so as to interpose the light receiving part 40. A p-type ohmic electrode 20 having a ring shape is provided on the p-type InGaAs layer in the periphery of a light receiving surface 48, and is connected to the p-side electrode pad 14 by an interconnection 22, which may be made of Au, for example. Thus, the p-side electrode pad 14 and the p-type InGaAs layer are electrically connected to each other. Each of the n-type ohmic electrode 16 and the p-type ohmic electrode 20 may be a multilayer composed of PT, Ti, Pt and Au stacked in this order from the semiconductor substrate 10.

The semiconductor substrate 10 has a rectangular shape, and defines device edges 11. That is, the periphery of the semiconductor substrate 10 defines the device edges 11. The rectangular shape may include a square shape. The light receiving part 40 is located close to a first corner 24, which is one of four corners (composed of the first corner 24 through a fourth corner 30) of the semiconductor substrate 10. That is, the light receiving part 40 is not located in the center of the semiconductor substrate 10 but is close to the first corner 24. In other words, assuming that the semiconductor substrate 10 is divided into first through fourth quadrants about the center of the semiconductor substrate 10, the center of the light receiving surface 48 is located in the first quadrant including the first corner 24.

The p-side electrode pad 14 is provided in the vicinity of the second corner 26 diagonally opposite to the first corner 24. That is, the p-side electrode pad 14 is located in the third quadrant including the second corner 26.

The two n-side electrode pads 12 are respectively provided in the vicinity of the third corner 28 and the fourth corner 30, which are the remainder of the four corners of the semiconductor substrate 10 other than the first corner 24 and the second corner 26. That is, the n-side electrode pads 12 are respectively located in the second and fourth quadrants including the third corner 28 and the fourth corner 30.

A minimum distance X1 between the p-side electrode pad 14 and the light receiving part 40, and a minimum distance X2 between the n-side electrode pads 12 and the light receiving part 40 satisfy the minimum requirements determined in terms of the breakdown voltages and the shapes. The minimum distance X1 between the p-side electrode pad 14 and the light receiving part 40 may be 41 μm or longer and is preferably 41 μm-51 μm. The minimum distance X2 between the n-side electrode pads 12 and the light receiving part 40 may be 17 μm or smaller and is preferably 7 μm-17 μm. The center of the light receiving surface 48 is located in the first quadrant, and the n-side electrode pads 12 are located in the second and fourth quadrants, while the p-side electrode pad 14 is located in the third quadrant. When the minimum distances X1 and X2 are ensured, a minimum distance Y1 between the p-side electrode pad 14 and the device edges are longer than a minimum distance Y2 between the n-side electrode pads 12 and the device edges 11. For example, in a case where the semiconductor substrate 10 has a square shape of 400 μm×400 μm, the minimum distance Y1 may be equal to or smaller than 35 μm and may be 25 μm, for example. The minimum distance Y2 may be equal to or smaller than 15 μm and may be 10 μm, for example. As described above, the p-side electrode pad 14 is closer to the center of the semiconductor substrate 10 than the n-side electrode pads 12.

Figure 2A:
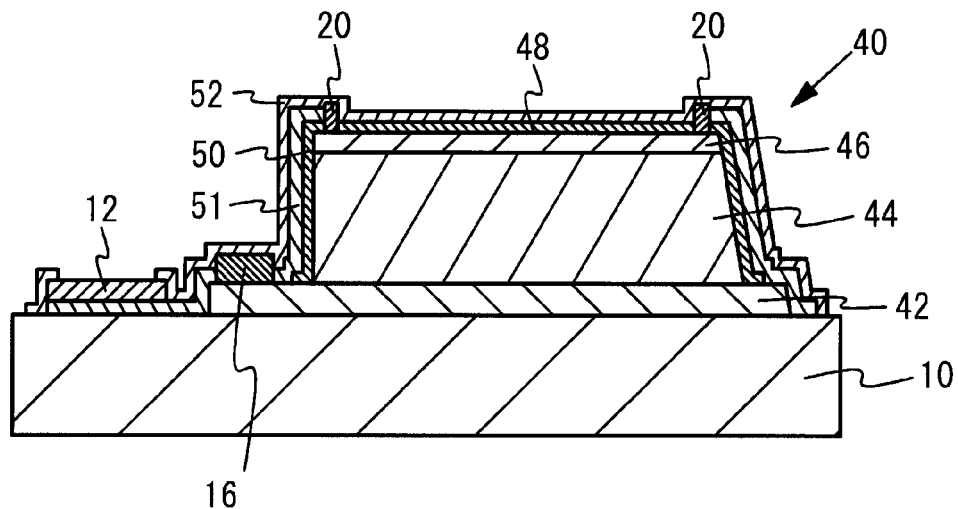
FIG. 2A is a cross-sectional view taken along a line A-A in FIG. 1
Figure 2B:
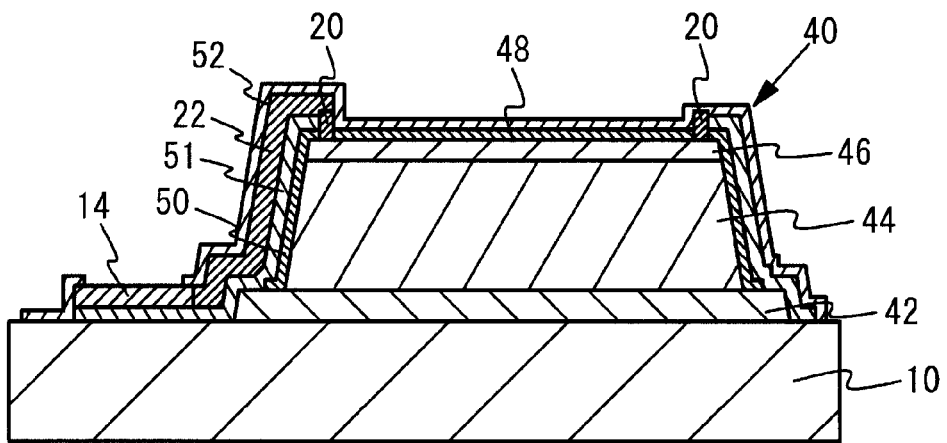
FIG. 2B is a cross-sectional view taken along a line B-B in FIG. 1.

FIG. 2A is a cross-sectional view taken along a line A-A depicted in FIG. 1, and FIG. 2B is a cross-sectional view taken along a line B-B in FIG. 1. Referring to FIGS. 2A and 2B, an n-type InGaAs layer 42, an InGaAs light absorbing layer 44, and a p-type InGaAs layer 46 are stacked on the semiconductor substrate 10 of the semi-insulating InP substrate in that order. The stacked layers 42, 44 and 46 form a multilayer structure. The light receiving part 40 has a mesa structure composed of the InGaAs light absorbing layer 44 and the p-type InGaAs layer 46. That is, peripheral portions of the InGaAs light absorbing layer 44 and the p-type InGaAs layer 46 formed on the n-type InGaAs layer 42 are removed therefrom so that a part of the upper surface of the n-type InGaAs layer 42 is exposed. The stacked structure of the n-type InGaAs layer 42, the InGaAs light absorbing layer 44 and the p-type InGaAs layer 46 may be formed on the semiconductor substrate by crystal growth method. The light receiving part has the mesa structure. The mesa structure may be formed by a wet etching process to the stacked structure. A part of the light receiving part 40 is forward tapered shape formed by wet etching due to the crystal orientation in the crystal growth.

The n-type ohmic electrodes 16 are formed on the n-type InGaAs layer 42. The p-type ohmic electrode 20 having a ring shape is formed on the p-type InGaAs layer 46 around the light receiving surface 48. A passivation film 50 made of InP, for example, is formed so as to cover the light receiving surface 48 on the p-type InGaAs layer 46, an area around the light receiving surface 48, and mesa side surfaces of the light receiving part 40. The p-type ohmic electrode 20 is exposed from the passivation film 50. An insulating film 51 made of SiN, for example, is formed so as to cover the chip surface except the light receiving surface 48. The n-type ohmic electrodes 16 and the p-type ohmic electrode 20 are exposed. Covering of the side surfaces of the light receiving part 40 by the passivation film 50 reduces dark current.

On the insulating film 51, there are provided interconnections (not illustrated) that connect the n-side electrode pads 12 and the n-type ohmic electrode 16. Further, on the insulating film, there are provided on the p-side electrode pad 14 and an interconnection 22 to connect the p-type ohmic electrode 20 to the p-side electrode pad 14. The interconnection 22 is formed along the forward tapered shape of the light receiving part 40. It is thus possible to restrain breaking of the interconnection 22. A protection film 52 is provided so as to cover the chip surface except the n-side electrode pads 12 and the p-side electrode pad 14. The protection film 52 is transparent to the wavelength of light incident to the light receiving surface 48 and is made of, for example, SiON.

Figure 3:
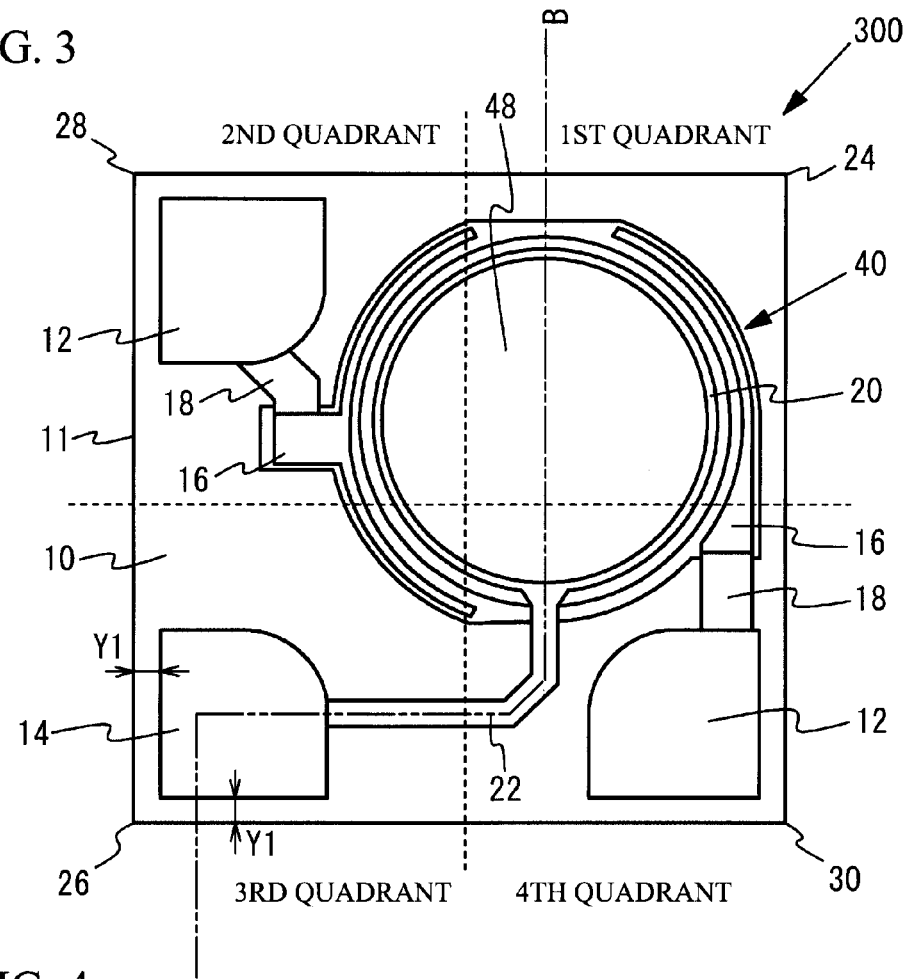
FIG. 3 is a schematic plan view of a semiconductor light receiving device in accordance with a first comparative example.

A description will now be given of a problem caused at the time of wire bonding by referring to a semiconductor light receiving device configured in accordance with a first comparative example. FIG. 3 is a schematic plan view of a semiconductor light receiving device 300 in accordance with the first comparative example. Referring to FIG. 3, the semiconductor light receiving device 300 of the first comparative example differs from the semiconductor light receiving device 100 of the first embodiment in that the p-side electrode pad 14 is closer to the second corner 26. In other words, the minimum distance Y1 between the p-side electrode pad 14 and the device edges 11 of the device 300 is smaller than that of the device 100. The remaining structures of the device 300 are similar to those of the device 100, and a description thereof are omitted here.

Figure 4:
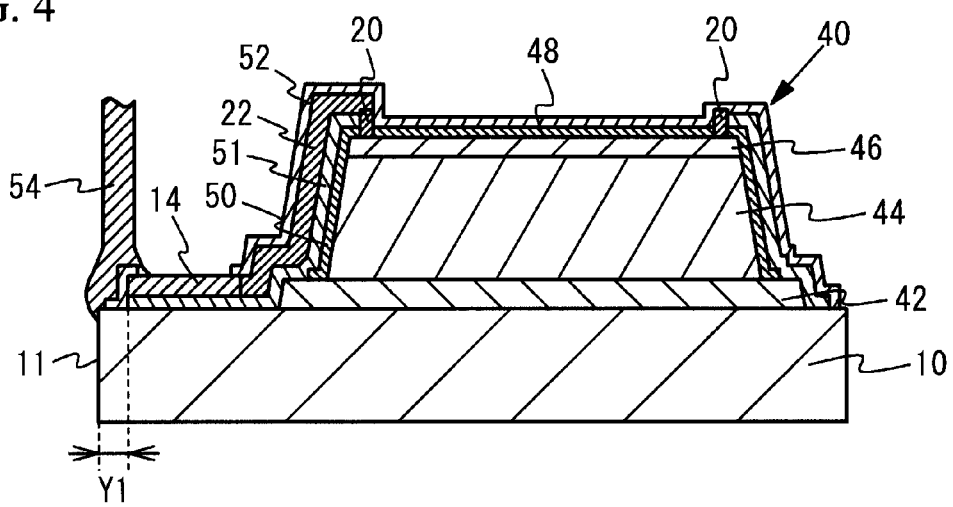
FIG. 4 is a cross-sectional view taken along a line B-B in FIG. 3.

FIG. 4 is a cross-sectional view taken along a line B-B depicted in FIG. 3 in which wire bonding has been carried out for the p-side electrode pad 14 of the semiconductor light receiving device 300 of the first comparative example. As illustrated in FIG. 4, in case where the precision of wire bonding is not good, a wire may protrude from the p-side electrode pad 14. When the minimum distance Y1 between the p-side electrode pad 14 and the device edges 11 is short as in the case of the device 300 of the first comparative example, the wire may extend to the side surface of the semiconductor substrate 10 from the p-side electrode pad 14. Thus, leakage current may flow between the p-side electrode pad 14 and the semiconductor substrate 10 and may degrade the device characteristics. The protruded wire bonding may short-circuit the p-side electrode pad 14 and the n-type InGaAs layer 42 via the semiconductor substrate 10, and may make it impossible to establish a normal potential difference between the n-type InGaAs layer 42 and the p-type InGaAs layer 46.

Figure 5:
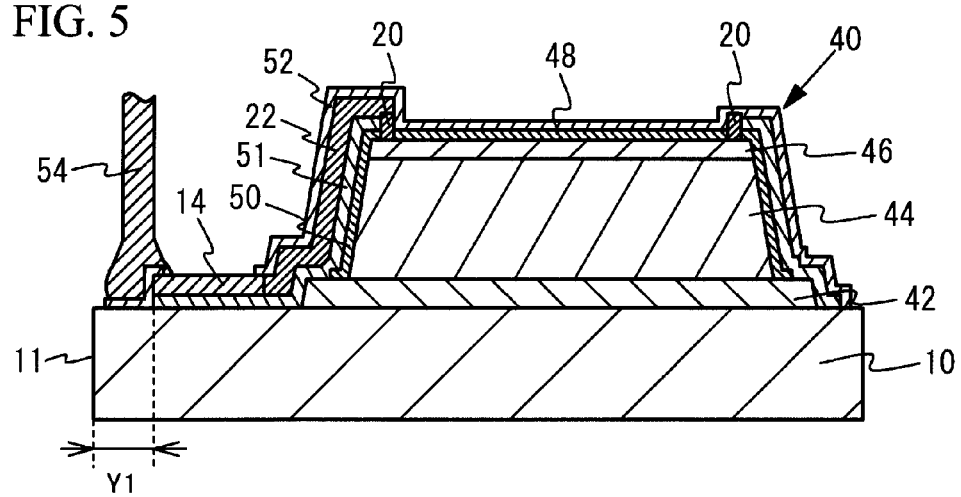
FIG. 5 is a cross-sectional view taken along the line B-B in FIG. 1 in a case where wire bonding is carried out for a p-side electrode pad.

A description will now be given of wire bonding carried out for the p-side electrode pad 14 of the semiconductor light receiving device 100 configured according to the first embodiment. FIG. 5 is a schematic cross-sectional view taken along the line B-B depicted in FIG. 1 in a case where wire bonding is carried out for the p-side electrode pad 14 of the semiconductor light receiving device 100 of the first embodiment. Referring to FIG. 5, even if the wire 54 protrudes from the p-side electrode pad 14, it is hard for the wire 54 to extend to the side surface of the semiconductor substrate 10 from the p-side electrode pad 14 because the long minimum distance Y1 between the p-side electrode pad 14 and the device edges 11 of the device 100 of the first embodiment can be ensured. Thus, the leakage current does not flow between the p-side electrode pad 14 and the semiconductor substrate 10.

As described above, according to the first embodiment, the n-type InGaAs layer 42, the InGaAs light absorbing layer 44 and the p-type InGaAs layer 46 are stacked in this order on the semiconductor substrate 10 that has a rectangular shape having the first corner 24 through the fourth corner 30 defines the device edges 11, as illustrated in FIG. 1. The InGaAs light absorbing layer 44 and the p-type InGaAs layer 46 form the mesa structure, which is the light receiving part 40, which is not located in the center of the semiconductor substrate 10 but is close to the first corner 24. The location of the light receiving part 40 close to the first corner 24 makes it possible to increase the size of the light receiving surface 48 and downsize the semiconductor light receiving device 100.

The p-side electrode pad 14 electrically connected to the p-type InGaAs layer 46 is provided in the vicinity of the second corner 26 of the semiconductor substrate 10 diagonally opposite to the first corner 24. It is thus possible to make the minimum distance Y1 between the p-side electrode pad 14 and the device edges 11 longer than the minimum distance Y2 between the n-side electrode pads 12 and the device edges 11 when the minimum distance X1 between the p-side electrode pad 14 and the light receiving part 40 and the minimum distance X2 between the n-side electrode pad 12 and the light receiving part 40 are ensured. Thus, as has been described with reference to FIG. 5, even if the precision of wire bonding to the p-side electrode pad 14 is not good and the wire 54 protrudes from the p-side electrode pad 14, the leakage current path can be restrained between the p-side electrode pad 14 and the semiconductor substrate 10 and a degradation of the characteristics of the semiconductor light receiving device 100 can be restrained. According to the first embodiment, it is possible to obtain the compact semiconductor light receiving device 100 having less degraded characteristics.

Since the distance Y2 between the n-side electrode pads 12 and the device edges 11 is short, in wire bonding to the n-side electrode pads 12, the wires 54 may protrude from the n-side electrode pads 12, and the n-side electrode pads 12 and the semiconductor substrate 10 may be short-circuited. However, since the n-type ohmic electrodes 16 and the semiconductor substrate 10 are at the electrically identical potential, the device characteristics may be restrained even in case where the wires 54 connect the n-side electrode pads 12 and the semiconductor substrate 10.

In the first embodiment illustrated in FIG. 1, each of the n-side electrode pads 12 and the p-side electrode pad 14 have a chamfered corner closer to the light receiving part 40. It is thus possible to realize downsizing of the semiconductor light receiving device 100 and increase the distance between the n-side electrode pads 12 and the light receiving part 40 and the distance between the p-side electrode pad 14 and the light receiving part 40.

The first embodiment has the mesa structure composed of the p-type InGaAs layer 46 and the InGaAs light absorbing layer 44. The first embodiment is not limited to the above mesa structure but may have another mesa structure. For example, the light receiving part 40 may have a mesa structure composed of the p-type InGaAs layer 46, the InGaAs light absorbing layer 44 and a part of the n-type InGaAs layer 42. That is, the light receiving part 40 is composed of at least the p-type InGaAs layer 46 and the InGaAs light absorbing layer 44.

In the above-described first embodiment, the n-side electrode pads 12 are respectively close to the third corner 28 and the fourth corner 30. However, the first embodiment is not limited to the above arrangement. For example, the n-side electrode pads 12 may be provided to close to either the third corner 28 or the fourth corner 30 or may be provided in a single position other than the vicinities of the third corner 28 and the fourth corner 30. Even in these cases, it is possible to realize the compact semiconductor light receiving device having less degraded characteristics. However, it is preferable that the n-side electrode pads 12 are respectively provided close to the third corner 28 and the fourth corner 30, as illustrated in FIG. 1. This is because of the following.

Figure 6:
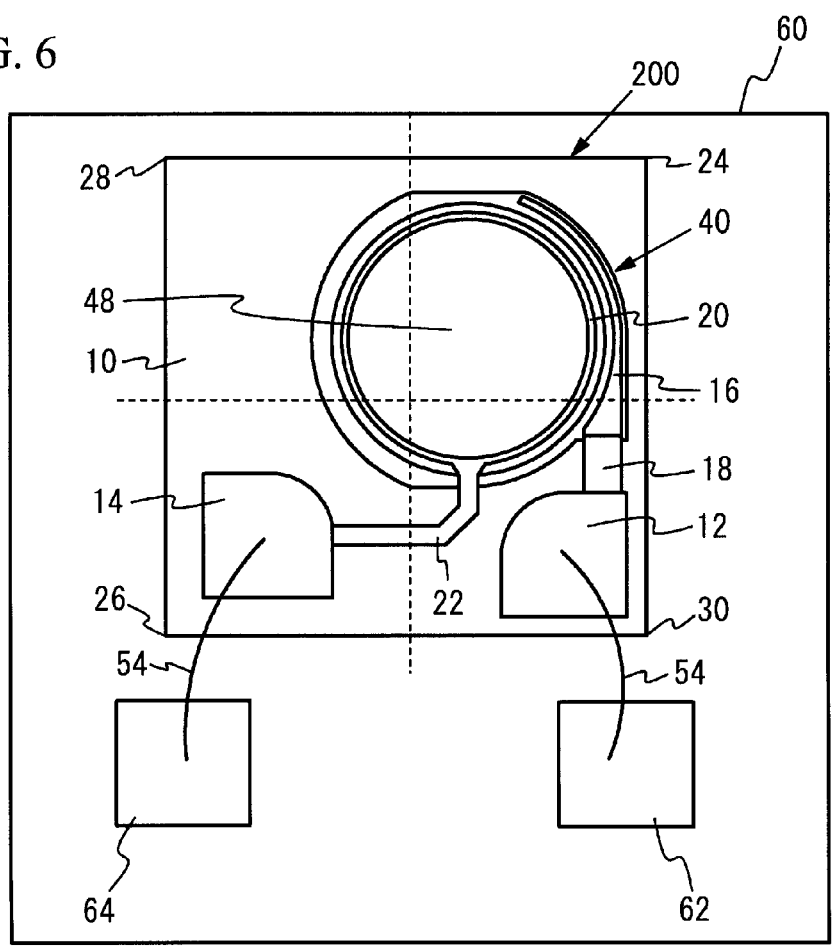
FIG. 6 is a schematic plan view of a semiconductor light receiving device in accordance with a variation of the first embodiment in which the device is mounted on a mounting part.

FIG. 6 is a schematic plan view of a variation of the semiconductor light receiving device of the first embodiment, which is mounted on a mounting part. Referring to FIG. 6, a semiconductor light receiving device 200 of the variation of the first embodiment is equipped with one n-side electrode pad 12 and one p-side electrode pad 14. The p-side electrode pad 14 is provided close to the second corner 26, and the n-side electrode pad 12 is provided close to the fourth corner 30. The remaining structures of the variation are similar to those of the first embodiment and are illustrated in FIG. 1.

There are provided one bonding wire 54 connecting the n-side electrode pad 12 and an n-side electrode pad 62 provided on the mounting part 60 and another bonding wire 54 connecting the p-side electrode pad 14 and a p-side electrode pad 64 provided on the mounting part 60. The device 200 with only one n-side electrode pad 12 and one p-side electrode pad 14 has a possibility that at least one of the wires 54 may pass over the light receiving surface 48 in a certain arrangement of the pads 12 and 14 of the device 200 and the pads 62 and 64 of the mounting part 60. In such a case, the light sensitivity may be degraded. There is another possibility that the wires 54 respectively connected to the pads 12 and 14 may contact each other.

Figure 7:
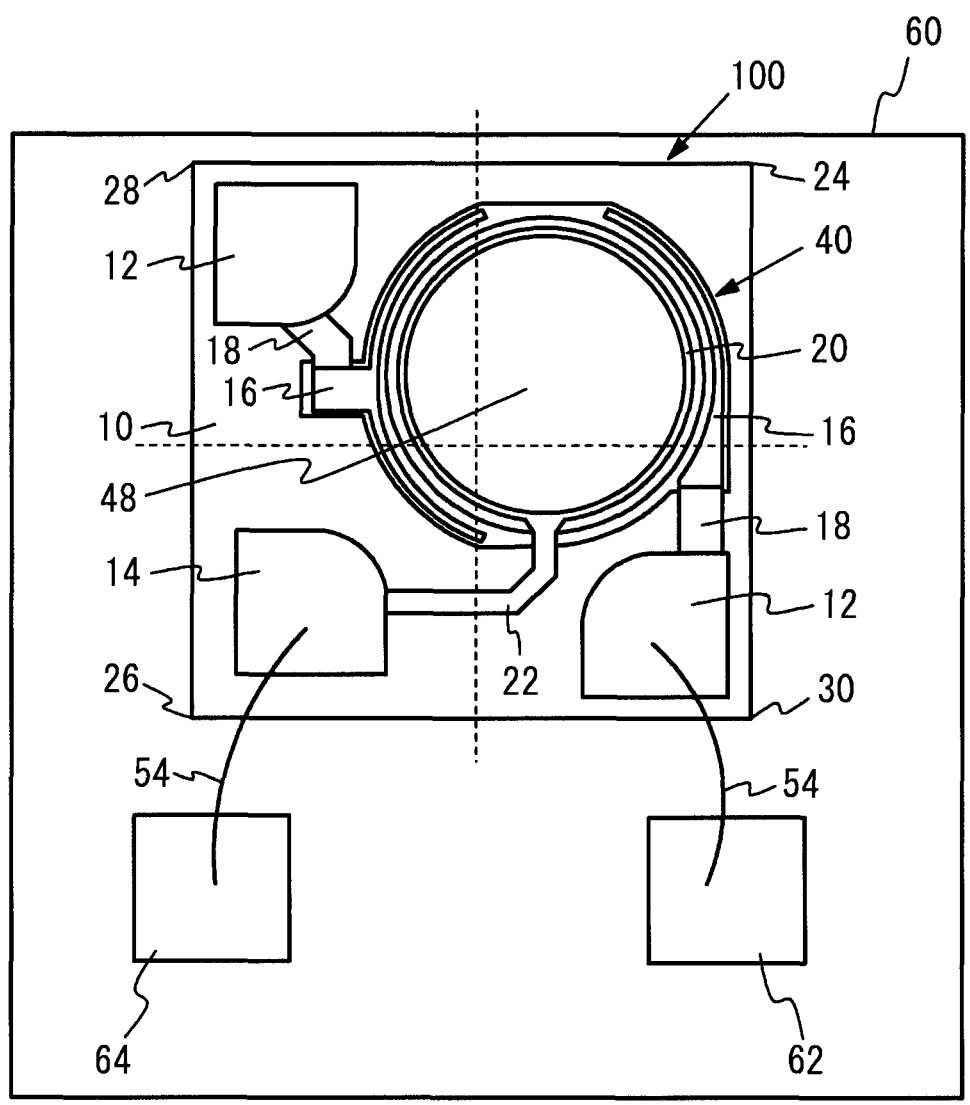
FIG. 7 is a schematic plan view of the semiconductor light receiving device of the first embodiment that is mounted on a mounting part.

FIG. 7 is a schematic plan view of the semiconductor light receiving device 100 of the first embodiment mounted on a mounting part. As illustrated in FIG. 7, the semiconductor light receiving device 100 of the first embodiment is equipped with the p-side electrode pad 14 in the vicinity of the second corner 26 and the n-side electrode pads 12 respectively in the vicinity of the third corner 28 and the fourth corner 30. This pad arrangement increases the degree of freedom of selecting the directions in which the wires 54 extend. It is thus possible to prevent the degradation of the light receiving sensitivity caused by the wires 54 that pass over the light receiving surface 48 and prevent the degradation of the device characteristics caused by the wires 54 that contact each other.

From the above, it is preferable that the n-side electrode pads 12 are provided close to the third and fourth corners 28 and 30 of the semiconductor substrate 10 other than the first corner 24 to which the light receiving part 40 is close and the second corner 26 to which the p-side electrode pad 14 is close. It is thus possible to prevent degradation of the light receiving sensitivity caused by the wires 54 that pass over the light receiving surface 48 and prevent the degradation of the device characteristics caused by the wires 54 that contact each other. Particularly, as has been described with reference to FIG. 7, the above effects of preventing the degradation of the light receiving sensitivity and that of the device characteristics caused by the wires 54 that contact each other are advantageous to an arrangement in which one n-side pad 62 is provided on the mounting part 60 and wire bonding is carried out for only one of the n-side electrode pads 12 respectively provided close to the third corner 28 and the fourth corner 30.

The n-side electrode pads 12 are not limited to the arrangement in which the n-side electrode pads 12 are respectively close to the third corner 28 and the fourth corner 30 but may be provided along two sides that defines the second corner 26, for example. That is, the n-side electrode pad 12, the p-side electrode pad 14 and the n-side electrode pad 12 may be provided in this order along the two sides that defines the second corner 26. In other words, the n-electrode pads 12 may be provided to two areas on the semiconductor substrate 10 defined by diagonally dividing the semiconductor substrate 10 into two with regard to the first corner 24. Even in this case, it is possible to increase the degree of freedom of selecting the directions in which the wires 54 extend and to prevent the degradation of the light receiving sensitivity caused by the wires 54 that pass over the light receiving surface 48 and the degradation of the device characteristics caused by the wires 54 that contact each other. The arrangement of the n-side electrode pads 12 respectively provided close to the third corner 28 and the fourth corner 30 as illustrated in FIG. 1 makes it possible to realize downsizing of the semiconductor light receiving device 100 in addition to the effects of preventing the degradation of the light receiving sensitivity and that of the device characteristics caused by the wires 54 that contact each other.

The first embodiment is not limited to the arrangement in which the first semiconductor layer of the first conduction type is the n-type InGaAs layer 42 and the second semiconductor layer of the second conduction type is the p-type InGaAs layer 46 but may have another arrangement in which the first conduction type is the p-type and the second conduction type is the n-type. The first and second semiconductor layers may be made of a material other than InGaAs taking the material of the semiconductor substrate 10 into consideration. The semiconductor substrate 10 is not limited to the semi-insulating InP substrate but may be a semi-insulating semiconductor substrate other than semi-insulating InP.

The present invention is not limited to the specifically described embodiments but other embodiments and variations may be made without departing from the scope of the present invention.

What is claimed is:

1. A semiconductor light receiving device comprising:
    a substrate having a rectangular shape with first through fourth corners;
    a multilayer structure formed on the substrate, the multilayer structure having a first semiconductor layer of a first conduction type, a light absorbing layer, and a second semiconductor layer of a second conduction type stacked on a semiconductor substrate in that order;
    a light receiving part having a mesa structure including at least the second semiconductor layer and the light absorbing layer, the mesa structure positioned away from a center part and towards the sides forming the first corner of the rectangular shape of the substrate;
    a first electrode pad provided on the semiconductor substrate and directly electrically connected to the first semiconductor layer; and
    a second electrode pad provided on the semiconductor substrate so as to be close to the second corner diagonally opposite to the first corner and directly electrically connected to the second semiconductor layer,
    a first minimum distance between the second electrode pad and an edge of the substrate closest to the second electrode pad being longer than a second minimum distance between the first electrode pad and an edge of the substrate closest to the first electrode pad,
    wherein a third minimum distance between the second electrode pad and the light receiving part being longer than a fourth minimum distance between the first electrode pad and the light receiving part;
    the substrate is divided into first through fourth quadrant about the center of the substrate, and the light receiving part not fitting into one quadrant.

2. The semiconductor light receiving device according to claim 1, wherein the first electrode pad and the second electrode pad are wire bonding pads.

3. The semiconductor light receiving device according to claim 1, wherein the semiconductor light receiving device has a plurality of first electrode pads respectively provided close to the third and fourth corners other than the first and second corners.

4. The semiconductor light receiving device according to claim 3, wherein a bonding wire is bonded to only one of a plurality of the first electrode pads provided close to at least one of the third and fourth corners.

5. The semiconductor light receiving device according to claim 1, wherein the semiconductor substrate is a semi-insulating semiconductor substrate.

6. The semiconductor light receiving device according to claim 1, wherein the semiconductor substrate is made of InP.

7. The semiconductor light receiving device according to claim 1, wherein the first semiconductor layer, the light absorbing layer and the second semiconductor layer are made of InGaAs.

8. The semiconductor light receiving device according to claim 1, further comprising a passivation film formed on a side face and upper face of the mesa structure.

9. The semiconductor light receiving device according to claim 8, wherein the passivation film is made of InP.

10. The semiconductor light receiving device according to claim 1, wherein the semiconductor substrate is 500 µm×500 µm or smaller.

11. The semiconductor light receiving device according to claim 1, wherein the first minimum distance is 15 µm or smaller and the second minimum distance is 35 µm or smaller.

12. The semiconductor light receiving device according to claim 1, wherein the third minimum distance is 17 um or smaller and the fourth minimum distance is 41 um or longer.

* * * * *